United States Patent
Chen et al.

(10) Patent No.: US 11,755,549 B2
(45) Date of Patent: Sep. 12, 2023

(54) METHOD, ELECTRONIC DEVICE, AND COMPUTER PROGRAM PRODUCT FOR DATA PROCESSING

(71) Applicant: EMC IP Holding Company LLC, Hopkinton, MA (US)

(72) Inventors: Tao Chen, Beijing (CN); Geng Han, Beijing (CN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 96 days.

(21) Appl. No.: 17/183,736

(22) Filed: Feb. 24, 2021

(65) Prior Publication Data
US 2022/0237158 A1 Jul. 28, 2022

(30) Foreign Application Priority Data
Jan. 22, 2021 (CN) .......................... 202110090766.3

(51) Int. Cl.
*G06F 16/215* (2019.01)
*H03M 7/40* (2006.01)

(52) U.S. Cl.
CPC ............ *G06F 16/215* (2019.01); *H03M 7/40* (2013.01)

(58) Field of Classification Search
CPC ................................ G06F 16/215; H03M 7/40
See application file for complete search history.

(56) References Cited

U.S. PATENT DOCUMENTS

| 8,095,756 | B1 * | 1/2012 | Somavarapu | G06F 11/1461 |
| | | | | 711/163 |
| 8,156,306 | B1 * | 4/2012 | Raizen | G06F 3/0641 |
| | | | | 711/202 |
| 9,659,060 | B2 * | 5/2017 | Chambliss | G06F 16/215 |
| 10,216,449 | B1 * | 2/2019 | Li | G06F 11/1451 |
| 10,382,751 | B1 * | 8/2019 | Zhao | H04N 19/105 |
| 10,409,495 | B1 * | 9/2019 | Baruch | G06F 3/0608 |

(Continued)

*Primary Examiner* — Tyler J Torgrimson
*Assistant Examiner* — Maher N Algibhah
(74) *Attorney, Agent, or Firm* — WOMBLE BOND DICKINSON (US) LLP (57) ABSTRACT

Embodiments of the present disclosure provide a method, an electronic device, and a computer program product for data processing. The method includes: determining, based on sizes of multiple data segments included in data to be processed, a first time required to perform a matching operation for each data segment, wherein the matching operation is used to determine non-duplicate data segments; determining, based on the size of each data segment and a compression level for the data to be processed, a second time required to perform a compression operation for each data segment; and determining, based on the first time, the second time, and a de-duplication rate for the data to be processed, a target mode for processing the multiple data segments from a first mode and a second mode, wherein in the first mode, a compression operation is performed only on the non-duplicate data segments in the multiple data segments, and in the second mode, a compression operation is performed on each of the multiple data segments. In this way, the data processing mode can be dynamically selected according to features of the data to be processed, thereby improving the efficiency of data processing.

18 Claims, 5 Drawing Sheets

(56) References Cited

U.S. PATENT DOCUMENTS

| | | | |
|---|---|---|---|
| 2010/0095108 A1* | 4/2010 | Kameyama | H04N 21/2343 713/150 |
| 2011/0208808 A1* | 8/2011 | Corbett | G06F 16/24539 709/238 |
| 2013/0198148 A1* | 8/2013 | Chambliss | G06F 16/1748 707/E17.002 |
| 2013/0301430 A1* | 11/2013 | Pamu | H04L 69/04 370/252 |
| 2016/0227001 A1* | 8/2016 | Kumano | H04L 69/04 |
| 2016/0323406 A1* | 11/2016 | Tsuji | G06F 13/102 |
| 2017/0013079 A1* | 1/2017 | Suzuki | H04N 21/44227 |
| 2017/0031831 A1* | 2/2017 | Bohra | G06F 12/0871 |
| 2017/0214773 A1* | 7/2017 | Fan | H03M 7/607 |
| 2018/0067961 A1* | 3/2018 | Yang | G06F 16/188 |
| 2018/0101330 A1* | 4/2018 | Yoon | G06F 3/0638 |
| 2018/0246649 A1* | 8/2018 | Datar | G06F 3/0641 |
| 2018/0253253 A1* | 9/2018 | Sakamoto | G06F 3/0608 |
| 2018/0329631 A1* | 11/2018 | Swift | G06F 3/0608 |
| 2019/0132480 A1* | 5/2019 | Hiramoto | H04N 1/41 |
| 2019/0294589 A1* | 9/2019 | Moiseev | G06F 12/0895 |
| 2019/0370356 A1* | 12/2019 | Kucherov | G06F 16/1756 |
| 2020/0019310 A1* | 1/2020 | Faibish | H03M 7/3091 |
| 2020/0192589 A1* | 6/2020 | Mehta | G06F 3/0605 |
| 2020/0192871 A1* | 6/2020 | Hirsch | G06F 16/1748 |
| 2021/0132837 A1* | 5/2021 | Goswami | G06F 3/0641 |
| 2021/0405882 A1* | 12/2021 | Venkatasubbaiah | G06F 16/285 |
| 2022/0245097 A1* | 8/2022 | Moran | G06F 16/1744 |

\* cited by examiner

METHOD, ELECTRONIC DEVICE, AND COMPUTER PROGRAM PRODUCT FOR DATA PROCESSING

CROSS-REFERENCE TO RELATED APPLICATION

This patent application claims priority, under 35 U.S.C. § 119, of Chinese Patent Application No. 202110090766.3, filed Jan. 22, 2021, which is incorporated by reference in its entirety.

TECHNICAL FIELD

Embodiments of the present disclosure relate to the field of computers, and more particularly, to a method, an electronic device, and a computer program product for data processing.

BACKGROUND

In the era of Big Data, the conflict between the existence of massive data and limited computational cost of storage systems raises the need to reduce the processing cost of data. It can be understood that during the processing of data, for example, when backing up the data to a storage system, it is necessary to perform de-duplication processing and compression processing on the data. There are different data processing modes, for example, performing the de-duplication operation before data compression, or performing de-duplication and compression operations together. Applying different modes for different types of data and different data de-duplication rates may require processing costs (e.g., time costs), and there are significant cost differences between them.

SUMMARY OF THE INVENTION

The embodiments of the present disclosure provide a solution for data processing.

In a first aspect of the present disclosure, a method for data processing is provided. The method includes: determining, based on sizes of multiple data segments included in data to be processed, a first time required to perform a matching operation for each data segment, wherein the matching operation is used to determine non-duplicate data segments; determining, based on the size of each data segment and a compression level for the data to be processed, a second time required to perform a compression operation for each data segment; and determining, based on the first time, the second time, and a de-duplication rate for the data to be processed, a target mode for processing the multiple data segments from a first mode and a second mode, wherein in the first mode, a compression operation is performed only on the non-duplicate data segments in the multiple data segments, and in the second mode, a compression operation is performed on each of the multiple data segments.

In a second aspect of the present disclosure, an electronic device is provided, including: a processor; and a memory coupled to the processor, wherein the memory has instructions stored therein that, when executed by the processor, cause the electronic device to perform actions including: determining, based on sizes of multiple data segments included in data to be processed, a first time required to perform a matching operation for each data segment, wherein the matching operation is used to determine non-duplicate data segments; determining, based on the size of each data segment and a compression level for the data to be processed, a second time required to perform a compression operation for each data segment; and determining, based on the first time, the second time, and a de-duplication rate for the data to be processed, a target mode for processing the multiple data segments from a first mode and a second mode, wherein in the first mode, a compression operation is performed only on the non-duplicate data segments in the multiple data segments, and in the second mode, a compression operation is performed on each of the multiple data segments.

In a third aspect of the present disclosure, a computer program product is provided that is tangibly stored on a computer-readable medium and includes machine-executable instructions, wherein the machine-executable instructions, when executed, cause a machine to perform any steps of the method according to the first aspect.

The Summary of the Invention section is provided to introduce the selection of concepts in a simplified form, which will be further described in the Detailed Description below. The Summary of the Invention section is neither intended to identify key features or main features of the present disclosure, nor intended to limit the scope of the present disclosure.

BRIEF DESCRIPTION OF THE DRAWINGS

The above and other objectives, features, and advantages of the present disclosure will become more apparent by describing example embodiments of the present disclosure in detail with reference to the accompanying drawings, and in the example embodiments of the present disclosure, the same reference numerals generally represent the same components. In the accompanying drawings.

DETAILED DESCRIPTION

The principles of the present disclosure will be described below with reference to some example embodiments shown in the accompanying drawings.

As used herein, the term "include" and variations thereof mean open-ended inclusion, that is, "including but not limited to." Unless specifically stated, the term "or" means "and/or." The term "based on" means "based at least in part on." The terms "an example embodiment" and "an embodiment" indicate "a group of example embodiments." The term "another embodiment" indicates "a group of additional embodiments." The terms "first," "second," etc. may refer to different or the same objects. Other explicit and implicit definitions may also be included below.

As discussed above, there are various data processing modes in a storage system. In a first processing mode, a matching operation is first performed on all data segments included in data, and then a compression operation is performed on non-duplicate data. In a second processing mode, a matching operation and a compression operation are both performed on all data segments included in the data. The time for performing both the matching operation and the compression operation on a single data segment in the second data processing mode described above can be considered in practical operations to be equal to the time for the compression operation in the first processing mode. In existing solutions, a single processing mode is adopted for all types of data. However, for data with a low de-duplication rate, the time required to apply the second processing mode is significantly lower than the time required to apply the first processing mode. For data with a low de-duplication rate, the time required to apply the first processing mode is significantly lower than the time required to apply the second processing mode. The low efficiency of applying a single data processing mode has become a bottleneck that limits the system performance.

In order to address, at least in part, the above disadvantages, the embodiments of the present disclosure provide a solution for data processing. In this solution, a first time required for a matching operation is first determined based on sizes of data segments in data to be processed, wherein the matching operation is used to determine non-duplicate data segments. Then, a second time required for a compression operation is determined based on the sizes and a compression level for the data to be processed. Finally, a target mode for the data to be processed is determined from a first mode and a second mode based on the above first time and second time and a de-duplication rate for the data to be processed. As a result, with this solution, an appropriate data processing mode may be selected according to features of the data, thereby reducing the data processing time and improving the efficiency of data processing.

Figure 1:
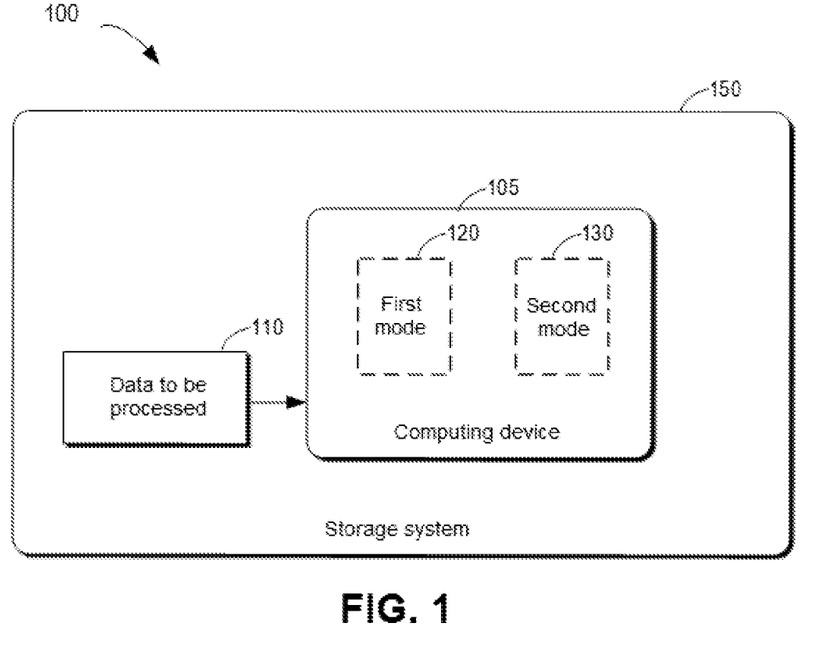
FIG. 1 illustrates a schematic diagram of an example environment according to embodiments of the present disclosure.

FIG. 1 illustrates a schematic diagram of example environment 100 according to embodiments of the present disclosure, in which a device and/or method according to embodiments of the present disclosure can be implemented. As shown in FIG. 1, as shown in FIG. 1, the example environment may include storage system 150. Storage system 150 may include computing device 105 for processing various operations for data storage, including but not limited to, data compression and decompression, data de-duplication, data storage, data backup, and data recovery.

Storage system 150 may include (multiple) storage disk(s), not shown, for storing data. The storage disk can be various types of devices with a storage function, including but not limited to, a hard disk drive (HDD), a solid state disk (SSD), a removable disk, any other magnetic storage device and any other optical storage device, or any combination thereof.

Computing device 105 can be configured to acquire sizes of data segments included in data to be processed 110, a de-duplication rate for data to be processed 110, a compression level for data to be processed 110, and the like.

Computing device 105 can be configured to compress data to be processed 110 to acquire compressed data 130. Compressed data 130 can be stored in the storage disk to save storage space of the storage disk.

In some embodiments, storage system 150 may be a storage system for data backup, which is configured with a duplicate data deletion (sometimes referred to as de-duplication or data de-duplication herein) device to remove duplicate portions of the data and store only the non-duplicate portions, thereby achieving efficient usage of the storage space. In some embodiments, the storage system can use an appropriate co-processor to perform a matching operation on the data, for example, performing an SHA1 operation on the data. The storage system can use this SHA1 operation to acquire a fingerprint of the data to be processed and match it with fingerprints of data already existing in the storage space to determine non-duplicate data. In some embodiments, the storage system can use various compression techniques to perform the compression operation on the data. In some embodiments, the storage system can be set to perform the compression operation on the data using various compression levels provided by various compression techniques.

An example processor for the appropriate co-processor described above is a Quick Assist Technology (QAT) card, which can be used to accelerate computationally intensive tasks such as compression and encryption. Adding a QAT card to the storage system can speed up the running of applications and improve the performance and efficiency of the storage system. Functions provided by the QAT card may include symmetric encryption, identity authentication, asymmetric encryption, digital signature, public key encryption, lossless data compression, and the like. In some cases, computing device 105 can process the data using first mode 120. For example, in first mode 120, computing device 105 can perform a data matching operation (e.g., an SAH1 operation or an HMAC SHA1 operation) and a compression operation separately on the data via the Quick Assist Technology (QAT) card. In some other cases, computing device 105 can process the data using second mode 130. For example, in second mode 130, computing device 105 can perform a data matching operation (e.g., an SAH1 operation) in combination with a compression operation (which may be collectively referred to as an "SHA1-compression chained operation") on the data via the Quick Assist Technology (QAT) card. In the following description, we consider that the time required to perform a data matching operation in combination with a compression operation on a data segment is equal to the time required to perform a compression operation alone on the same data segment (in practice, the difference therebetween is very little, i.e., less than a threshold, and thus is negligible in the operation of the storage system).

Note that the above QAT and SHA1 operations are only examples and other appropriate processors and algorithms can also be applied, and the present disclosure is not limited in this respect.

It can be understood that, in some cases, for example, in the 0-generation backup case, i.e., the data de-duplication rate is 0, it is more appropriate to apply the data processing mode that combines a matching operation and a compression operation. In some other cases, for example, when the data de-duplication rate is greater than 90%, it is more appropriate to apply the data processing mode of first performing a matching operation for deduplication, and then performing a compression operation. In addition, various features of the data, such as sizes of the data segments, the de-duplication rate of the data, and the compression level of the data, will also have an impact on the processing time for the data. Therefore, based on various features of data to be processed 110, storage system 150 (e.g., computing device 105 of the storage system) can dynamically determine which data processing mode to apply.

Figure 2:
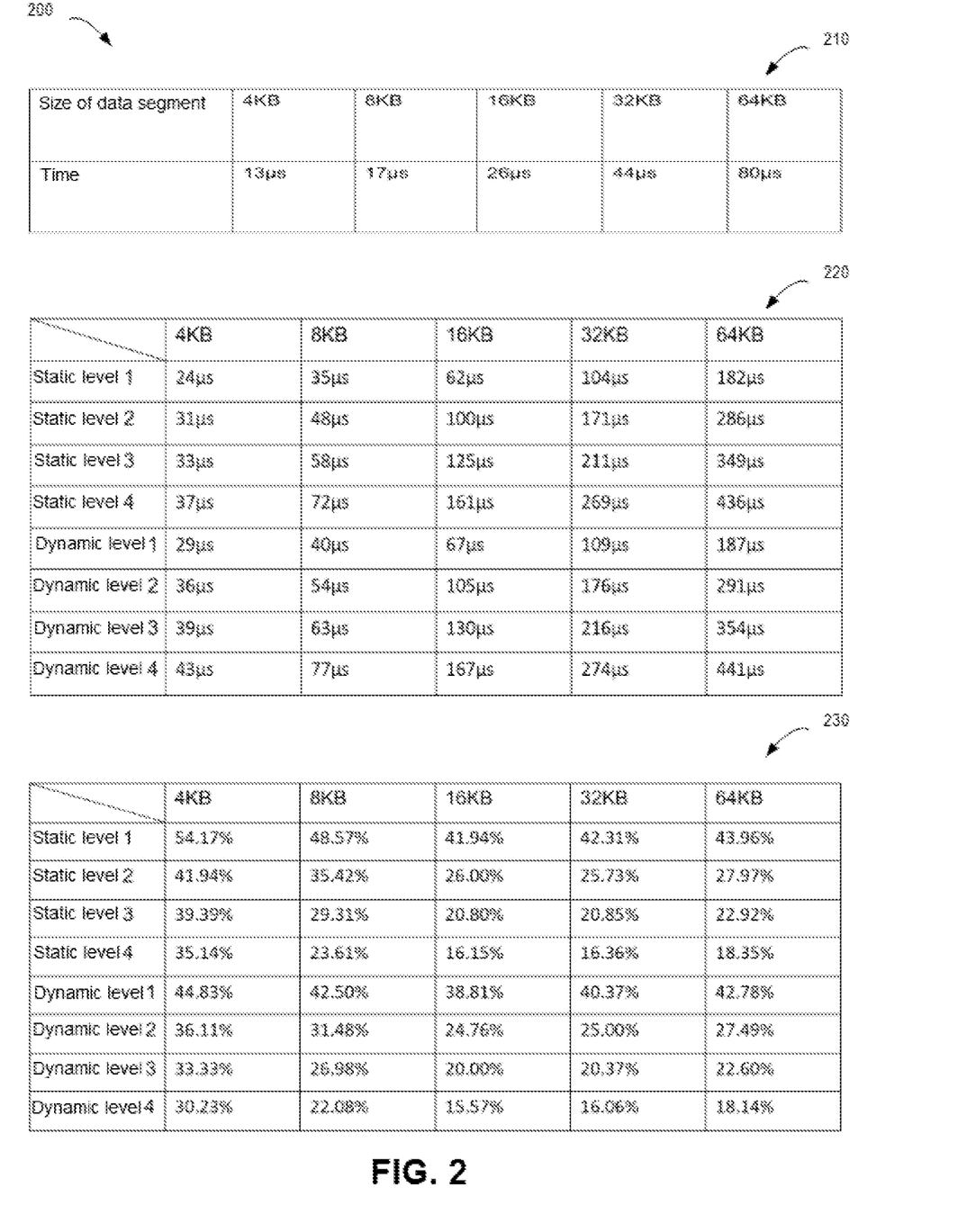
FIG. 2 illustrates a schematic diagram of various charts of various indexes related to sizes of data segments and compression levels.

The process according to embodiments of the present disclosure will be described in detail below in connection with FIGS. 2A to 2B, FIG. 3, and FIG. 4. For ease of understanding, specific data mentioned in the following description are all examples and are not intended to limit the scope of protection of the present disclosure. It should be understood that the embodiments described below may also include additional actions not shown and/or may omit actions shown, and the scope of the present disclosure is not limited in this regard.

FIG. 2 illustrates schematic diagram 200 of various charts of data processing time related to compression levels and/or sizes of data segments. It should be noted that FIG. 2 only illustrates charts of various indexes corresponding to various compression levels provided by the QAT compression technique in one hardware configuration. It can be understood that, in the case where other different hardware configurations are adopted and/or other compression techniques are adopted, similar charts can be obtained by those skilled in the art through testing of the storage system.

Chart 210 illustrates the time required for a matching operation for different sizes of data segments according to embodiments of the present disclosure, wherein the matching operation may be an HMAC SHA1 algorithm in the SHA1 algorithm in the storage system. The SHA1 algorithm and the values in the chart are only examples, and other appropriate matching operations may also be applied to determine non-duplicate data segments.

Chart 220 illustrates the time required for a compression operation for different sizes of data segments at various compression levels according to embodiments of the present disclosure. Compression and/or decompression can be of two types, dynamic and static, which can refer to dynamic huffman data compression and/or decompression, and static Huffman data compression and/or decompression, respectively.

For example, QAT compression techniques can provide dynamic compression level 1 to dynamic compression level 4 (sometimes briefly referred to as dynamic level herein), and static compression level 1 to static compression level 4 (sometimes referred to briefly as static level herein). At different compression levels, the required compression time varies. Additionally, the sizes of the data segments, e.g., 1 KB, 4 KB, 8 KB, 16 KB, and 64 KB, may also affect the throughput.

Chart 230 illustrates the ratio of the time required for the matching operation to the time required for the compression operation for different sizes of data segments at various compression levels according to embodiments of the present disclosure (the time required for the matching operation/the time required for the compression operation). The time required for the matching operation and the time required for the compression operation can be derived from chart 210 and chart 220.

It can be understood that, in the case where other different hardware configurations are adopted and/or other matching operations and compression operations are adopted, the exact values of various indexes similar to those shown in the above charts can vary, but the relationships therebetween are similar to those described above with reference to the above charts.

Figure 3:
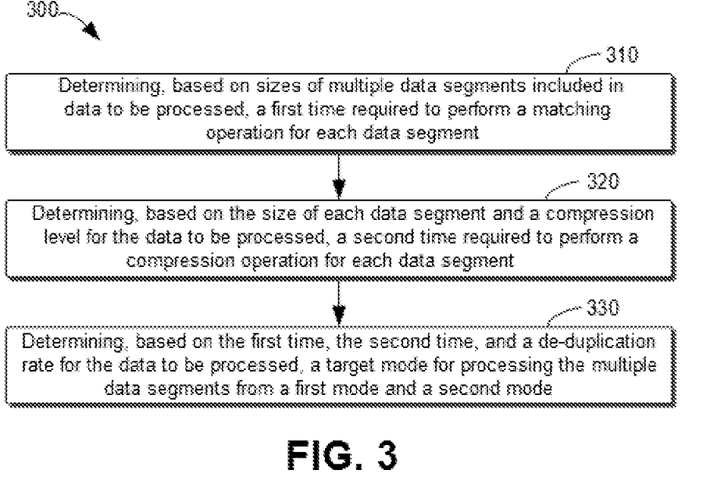
FIG. 3 illustrates a flow chart of a process for data processing according to embodiments of the present disclosure.

FIG. 3 illustrates a flow chart of process 300 for data processing according to embodiments of the present disclosure. Process 300 can be implemented at computing device 105 shown in FIG. 1.

At 310, computing device 105 determines, based on sizes of multiple data segments included in data to be processed 110, a first time required to perform a matching operation for each data segment, wherein the matching operation is used to determine non-duplicate data segments.

Specifically, data to be processed 110 is data that is expected to be processed using various operations (techniques or algorithms), for example. In some embodiments, the data to be processed may be data to be stored (e.g., to be backed up) in the storage system. In some embodiments, the data to be processed may also be data obtained after the above data to be stored is processed through data de-duplication, and this data may be stored in the storage disk after compression processing for subsequent retrieval.

Alternatively, in some embodiments, stored data that has been stored in the storage disk is also expected to be compressed using various compression techniques or algorithms when data recovery processing such as garbage collection is performed, for example. In this case, the data to be processed may also be data to be recovered.

Data to be processed 110 may be in the form of a data stream, which may include multiple data segments, wherein sizes of the multiple data segments can be obtained in various ways. In some embodiments, computing device 105 can determine the sizes of the data segments by utilizing various monitors of storage system 150. For example, parameters of the sizes of the data segments can be monitored in real time through a data segment size monitor, and additionally or alternatively, such parameters can be used to calculate the sizes of the multiple data segments included in data to be processed 110. Alternatively, in some embodiments, computing device 105 can directly configure the sizes of the multiple data segments included in data to be processed 110.

Computing device 105 can perform a matching operation on each of the multiple data segments to determine non-duplicate data segments. For example, computing device 105 can perform a fingerprint matching operation (e.g., using the SHA1 algorithm) on each data segment to acquire a data fingerprint of the data segment and then compare that data fingerprint with existing data in the memory to determine non-duplicate data segments. This is only an example, and various appropriate matching operations can also be applied to determine non-duplicate data segments. It can be understood that the matching operation time for a different data segment size is different, for example, as shown in chart 210 in FIG. 2.

In some embodiments, computing device 105 can determine an average of sizes of data segments that were processed over a historical time period, and then determine a first time through the average. For example, computing device 105 can determine, via a data segment monitor, that the sizes of the data segments that were processed over the last 24 hours is 16 KB. Computing device 105 can then determine, via chart 210, that the first time is 26 μs.

Alternatively, in some embodiments, computing device 105 can receive, via for example a user configuration interface, a size of a data segment input by a user, and can then determine the first time through chart 210.

At 320, computing device 105 determines, based on the size of each data segment and a compression level for data to be processed 110, a second time required to perform a compression operation for each data segment. For example, after determining non-duplicate data segments, computing device 105 can perform a compression operation on the non-duplicate data segments.

It can be understood that the better the compression level, the higher the compression ratio, and thus the less storage space the compressed data requires. However, the storage system usually needs to meet certain time requirements when processing data. In some cases, for a large amount of data to be compressed in unit time, adopting, for example, the best compression level is likely to cause the storage system to take too long time to process data, thus failing to meet a predetermined time requirement. In some other cases, for a small amount of data to be compressed in unit time, using, for example, the worst compression level can meet the predetermined delay requirements, but it may lead to unnecessary occupation of storage space.

Therefore, in some embodiments, computing device 105 can select a suitable optimal compression level according to the amount of data to be processed 110 or the number of the non-duplicate data segments determined above, such that the predetermined time requirement can be met while the compression rate of the compressed data is maximized.

Alternatively, in some embodiments, computing device 105 can also determine the compression level for data to be processed 110 according to an average compression level over a historical time period. Additionally or alternatively, in some embodiments, computing device 105 can receive, via for example a user configuration interface, a compression level input by a user.

After computing device 105 determines the sizes of the data segments and the compression level, computing device 105 can determine the second time required to perform the compression operation for each data segment. In some embodiments, computing device 105 can acquire a compression-level mapping table, wherein the compression-level mapping table includes multiple compression operation times corresponding to multiple sizes of data segments and multiple compression levels. Computing device 105 can then determine the second time from the multiple compression operation times based on the compression-level mapping table, the sizes of the data segments, and the compression levels.

Specifically, computing device 105 can first acquire chart 220 in FIG. 2. Chart 220 is a compression-level mapping table, which can be acquired from a local database or acquired externally, or can also be determined dynamically by computing device 105 according to historical data. It can be seen from chart 220 that there is a compression time for each data segment size and each compression level. For example, for a compression operation of static level 1 and a data segment with a size of 4 KB, a compression time of 24 µs is required. After acquiring this compression-level mapping table, based on the size of the data segment and the compression level (e.g., 16 KB and dynamic level 3) determined above, computing device 105 can determine from the multiple compression times in chart 220 that a second time for the compression operation for that data segment is 130 µs.

Determining a compression level of data and sizes of data segments by various appropriate methods can save costs in terms of time and storage resources in subsequent processing. At the same time, it lays the foundation for the subsequent dynamic selection of processing modes.

At 330, computing device 105 determines, based on the first time, the second time, and a de-duplication rate for data to be processed 110, a target mode for processing the multiple data segments from first mode 120 and second mode 130, wherein in first mode 120, a compression operation is performed only on the non-duplicate data segments in the multiple data segments, and in second mode 130, a compression operation is performed on each of the multiple data segments.

Specifically, after determining the above first time and second time, computing device 105 can determine whether to apply first mode 120 or second mode 130 according to the first time, the second time, and the de-duplication rate of the data, i.e., the ratio of data, in the data to be processed, that already exists in the storage system to the data to be processed.

Figure 4:
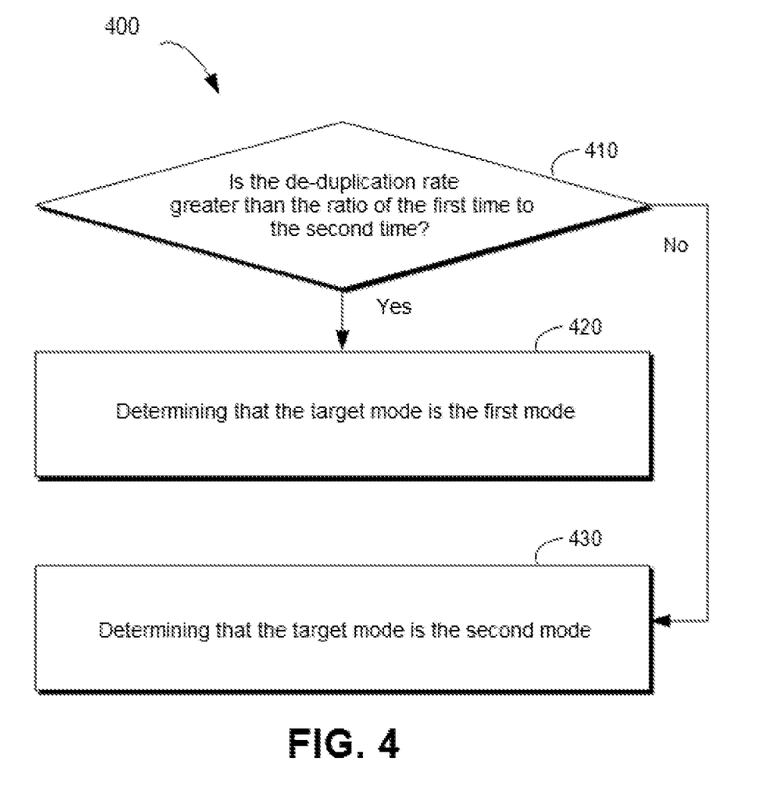
FIG. 4 illustrates a flow chart of a process for determining a target mode according to embodiments of the present disclosure.

The mode determination and the data processing in different modes will be described specifically with reference to FIG. 4. FIG. 4 illustrates a flow chart of process 400 for determining a target mode according to embodiments of the present disclosure.

Before presenting the implementation, first mode 120 and second mode 130 in which the data are processed will be first introduced. Definitions of some parameters are first introduced for subsequent description. The number of data segments in data to be processed 110 is defined to be N, the de-duplication rate of data to be processed 110 is R, the above first time is S (e.g., the time in chart 210), and the above second time is C (e.g., the time in chart 220). In the first mode, computing device 105 first performs a matching operation on all data segments to determine non-duplicate data segments, and then performs a compression operation on the non-duplicate data segments. The time A required to process data to be processed 110 using the first mode is:

$$A = S*N + (1-R)*N*C \qquad \text{Equation (1)}$$

In the second mode, computing device 105 performs a matching operation and a compression operation on all data segments (which, as already described above, may be a chained operation and are equal in time to the compression operation). The time B required to process data to be processed 110 using the second mode is:

$$B = C*N \qquad \text{Equation (2)}$$

Compare Equation (1) and Equation (2), and it can be concluded that when A<B, i.e., R>S/C, using the first mode saves time; and when A>B, i.e., when R<S/C, using the second mode saves time. That is, the ratio of the first time to the second time is the threshold for determining whether to utilize the first mode or the second mode.

At 410, computing device 105 determines whether the de-duplication rate is greater than a ratio of the first time to the second time. The method of acquiring the de-duplication rate of data to be processed 110 is similar to the method of acquiring the sizes of data segments and the compression level of data to be processed 110, i.e., through historical data or by receiving configuration data, and will not be repeated here. Computing device 105 can determine the first time and the second time according to the method of blocks 210 and 220 above, and then compare the de-duplication rate with the ratio.

In some embodiments, computing device 105 can acquire a predetermined chart 230 from a database, wherein on chart 230, a ratio of the first time to the second time S/C corresponding to each compression level and a size of each data segment is stored. After determining the de-duplication rate, the sizes of data segments, and the compression level of data to be processed 110, the size relationship between de-duplication rates and corresponding ratios can be determined directly according to chart 230.

At 420, computing device 105 determines that the de-duplication rate is greater than the ratio of the first time to the second time, and then determines that the target mode is the first mode. In the case where computing device 105 determines that the target mode is the first mode, computing device 105 can perform a matching operation on the multiple data segments, respectively. Computing device 105 can then determine, based on results of the matching operations, a set of data segments to be compressed from the multiple data segments, for example, determining the non-duplicate data segments as the set of data segments to be compressed. Then, computing device 105 performs the compression operation on the set of data segments to be compressed in accordance with the compression level.

At 430, computing device 105 determines that the de-duplication rate is less than the ratio of the first time to the second time, and then determines that the target mode is the second mode. In the case where computing device 105 determines that the target mode is the second mode, computing device 105 performs a matching operation and a compression operation, e.g., the chained operation described above, on each of the multiple data segments in accordance with the compression level. It can be understood that in the case where the de-duplication rate is equal to the above ratio, either of the first and second modes can be applied.

According to the solution of the present disclosure, the processing mode with the lowest processing time cost can be dynamically selected based on various characteristics of data, i.e., the sizes of the data segments, the compression level, and the de-duplication rate. The amount of data processed per unit of time (throughput) can be significantly increased by applying the second mode (chained processing) in the case of low de-duplication rate or the first mode (independent processing) in the case of high de-duplication rate. This solution can increase the speed of data processing by utilizing the performance of storage space to the largest extent, thus enhancing users' use experience of the storage system to which the solution is applied.

Figure 5:
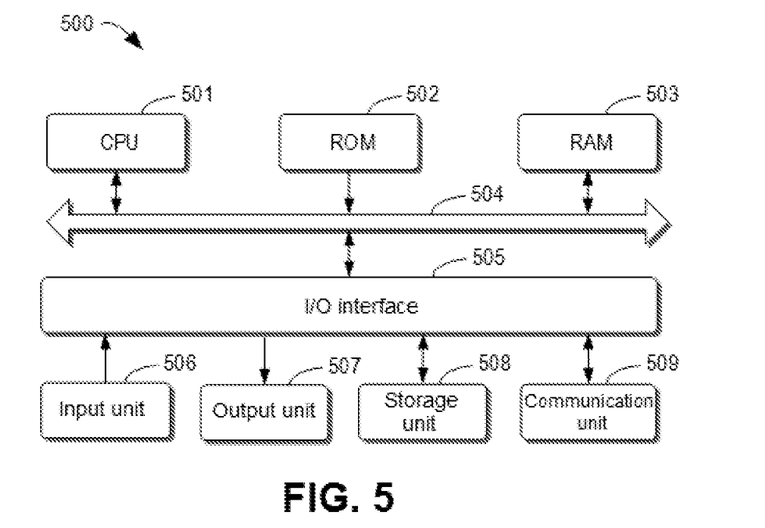
FIG. 5 illustrates a block diagram of an example device that can be used to implement embodiments of the present disclosure.

FIG. 5 illustrates a schematic block diagram of example electronic device 500 that can be used to implement the embodiments of the present disclosure. For example, electronic device 500 can be used to implement computing device 105 shown in FIG. 1. As shown in the figure, device 500 includes central processing unit (CPU) 501 that may perform various appropriate actions and processing according to computer program instructions stored in read-only memory (ROM) 502 or computer program instructions loaded from storage unit 508 into random access memory (RAM) 503. In RAM 503, various programs and data required for the operation of device 500 may also be stored. CPU 501, ROM 502, and RAM 503 are connected to one another through bus 504. Input/output (I/O) interface 505 is also connected to bus 504.

Multiple components in device 500 are connected to I/O interface 505, including: input unit 506, such as a keyboard and a mouse; output unit 507, such as various types of displays and speakers; storage unit 508, such as a magnetic disk and an optical disk; and communication unit 509, such as a network card, a modem, and a wireless communication transceiver. Communication unit 509 allows device 500 to exchange information/data with other devices through a computer network such as the Internet and/or various telecommunication networks.

Processing unit 501 executes various methods and processing described above, e.g., any one of processes 300 to 400. For example, in some embodiments, any one of processes 300 to 400 may be implemented as a computer software program or a computer program product that is tangibly included in a machine-readable medium, e.g., storage unit 508. In some embodiments, part or all of the computer program may be loaded and/or installed to device 500 via ROM 502 and/or communication unit 509. When the computer program is loaded into RAM 503 and executed by CPU 501, one or more steps of any one of processes 300 to 400 described above may be performed. Alternatively, in other embodiments, CPU 501 may be configured in any other suitable manner (e.g., by means of firmware) to implement any one of processes 300 to 400.

The present disclosure may be a method, an apparatus, a system, and/or a computer program product. The computer program product may include a computer-readable storage medium on which computer-readable program instructions for performing various aspects of the present disclosure are loaded.

The computer-readable storage medium may be a tangible device capable of retaining and storing instructions used by an instruction-executing device. For example, the computer-readable storage medium may be, but is not limited to, an electrical storage device, a magnetic storage device, an optical storage device, an electromagnetic storage device, a semiconductor storage device, any non-transitory storage device, or any appropriate combination of the above. More specific examples (a non-exhaustive list) of the computer-readable storage medium include: a portable computer disk, a hard disk, a random access memory (RAM), a read-only memory (ROM), an erasable programmable read-only memory (EPROM or a flash memory), a static random access memory (SRAM), a portable compact disc read-only memory (CD-ROM), a digital versatile disc (DVD), a memory stick, a floppy disk, a mechanical encoding device, for example, a punch card or a raised structure in a groove with instructions stored thereon, and any appropriate combination of the foregoing. The computer-readable storage medium used herein is not to be interpreted as transient signals per se, such as radio waves or other freely propagating electromagnetic waves, electromagnetic waves propagating through waveguides or other transmission media (e.g., light pulses through fiber-optic cables), or electrical signals transmitted through electrical wires.

The computer-readable program instructions described herein can be downloaded from a computer-readable storage medium to various computing/processing devices, or downloaded to an external computer or external storage device via a network, such as the Internet, a local area network, a wide area network, and/or a wireless network. The network may include copper transmission cables, fiber optic transmission, wireless transmission, routers, firewalls, switches, gateway computers, and/or edge servers. A network adapter card or network interface in each computing/processing device receives computer-readable program instructions from the network and forwards the computer-readable program instructions for storage in the computer-readable storage medium in each computing/processing device.

The computer program instructions for executing the operation of the present disclosure may be assembly instructions, instruction set architecture (ISA) instructions, machine instructions, machine-dependent instructions, microcode, firmware instructions, state setting data, or source code or object code written in any combination of one or more programming languages, the programming languages including object-oriented programming languages such as Smalltalk, C++, and the like, and conventional procedural programming languages such as the C language or similar programming languages. The computer-readable program instructions may be executed entirely on a user's computer, partly on a user's computer, as a stand-alone software package, partly on a user's computer and partly on a remote computer, or entirely on a remote computer or a server. In the case where a remote computer is involved, the remote computer may be connected to a user computer over any kind of networks, including a local area network (LAN) or a wide area network (WAN), or may be connected to an external computer (e.g., connected over the Internet using an Internet service provider). In some embodiments, an electronic circuit, for example, a programmable logic circuit, a field programmable gate array (FPGA), or a programmable logic array (PLA), is personalized by utilizing state information of the computer-readable program instructions, wherein the electronic circuit may execute computer-readable program instructions so as to implement various aspects of the present disclosure.

Various aspects of the present disclosure are described here with reference to flow charts and/or block diagrams of the method, the apparatus (system), and the computer program product according to the embodiments of the present disclosure. It should be understood that each block of the flow charts and/or block diagrams and combinations of blocks in the flow charts and/or block diagrams can be implemented by computer-readable program instructions.

These computer-readable program instructions can be provided to a processing unit of a general-purpose computer, a special-purpose computer, or a further programmable data processing apparatus, thereby producing a machine, such that these instructions, when executed by the processing unit of the computer or the further programmable data processing apparatus, produce means for implementing functions/actions specified in one or more blocks in the flow charts and/or block diagrams. These computer-readable program instructions may also be stored in a computer-readable storage medium, and these instructions cause a computer, a programmable data processing apparatus, and/or other devices to work in a specific manner; and thus the computer-readable medium having stored instructions includes an article of manufacture including instructions that implement various aspects of the functions/actions specified in one or more blocks in the flow charts and/or block diagrams.

The computer-readable program instructions may also be loaded to a computer, a further programmable data processing apparatus, or a further device, so that a series of operating steps may be performed on the computer, the further programmable data processing apparatus, or the further device to produce a computer-implemented process, such that the instructions executed on the computer, the further programmable data processing apparatus, or the further device may implement the functions/actions specified in one or more blocks in the flow charts and/or block diagrams.

The flow charts and block diagrams in the drawings illustrate the architectures, functions, and operations of possible implementations of the systems, methods, and computer program products according to various embodiments of the present disclosure. In this regard, each block in the flow charts or block diagrams may represent a module, a program segment, or part of an instruction, the module, program segment, or part of an instruction including one or more executable instructions for implementing specified logical functions. In some alternative implementations, functions marked in the blocks may also occur in an order different from that marked in the accompanying drawings. For example, two successive blocks may actually be executed in parallel substantially, or they may be executed in an opposite order sometimes, depending on the functions involved. It should be further noted that each block in the block diagrams and/or flow charts as well as a combination of blocks in the block diagrams and/or flow charts may be implemented using a special hardware-based system that executes specified functions or actions, or using a combination of special hardware and computer instructions.

Various implementations of the present disclosure have been described above. The foregoing description is illustrative rather than exhaustive, and is not limited to the disclosed implementations. Numerous modifications and alterations are apparent to persons of ordinary skill in the art without departing from the scope and spirit of the illustrated implementations. The selection of terms used herein is intended to best explain the principles and practical applications of the implementations or the improvements to technologies on the market, or to enable other persons of ordinary skill in the art to understand the implementations disclosed herein.

The invention claimed is:

1. A method for data processing, including:
   determining, based on sizes of multiple data segments included in data to be processed, a first time required to perform a matching operation for each data segment, wherein the matching operation is used to determine non-duplicate data segments;
   determining, based on the size of each data segment and a compression level for the data to be processed, a second time required to perform a compression operation for each data segment, wherein a different compression level corresponds to a different compression ratio, different storage space that compressed data requires, and different time requirements to process;
   determining, based on the first time, the second time, and a de-duplication rate for the data to be processed, a target mode for processing the multiple data segments from a first mode and a second mode,
      wherein in the first mode, a compression operation is performed only on the non-duplicate data segments in the multiple data segments based on a time required to process the data using the first mode, the first time, the second time, and the de-duplication rate of the data to be processed, and
      wherein in the second mode, a compression operation is performed on each of the multiple data segments; and
   performing the matching operation and the compression operation based on the target mode.

2. The method according to claim 1, wherein determining the target mode includes:
   determining that the target mode is the first mode if it is determined that the de-duplication rate is greater than a ratio of the first time to the second time; and
   determining that the target mode is the second mode if it is determined that the de-duplication rate is less than the ratio of the first time to the second time.

3. The method according to claim 1, wherein the target mode is the first mode, and the method further includes:
   performing the matching operation for the multiple data segments, respectively;
   determining, based on results of the matching operations, a set of data segments to be compressed from the multiple data segments; and
   performing the compression operation on the set of data segments to be compressed in accordance with the compression level.

4. The method according to claim 1, wherein the target mode is the second mode, and the method further includes:
   performing the matching operation and the compression operation on each of the multiple data segments in accordance with the compression level.

5. The method according to claim 1, wherein determining the first time includes:

determining an average of sizes of data segments that were processed over a historical time period; and
determining the first time based on the average.

6. The method according to claim 1, wherein determining the second time includes:
acquiring a compression-level mapping table, wherein the compression-level mapping table includes multiple compression operation times corresponding to multiple sizes of data segments and multiple compression levels; and
determining the second time from the multiple compression operation times based on the compression-level mapping table, the sizes of the data segments, and the compression levels.

7. An electronic device, including:
a processor; and
a memory coupled to the processor, wherein the memory has instructions stored therein that, when executed by the processor, cause the electronic device to perform actions including:
determining, based on sizes of multiple data segments included in data to be processed, a first time required to perform a matching operation for each data segment, wherein the matching operation is used to determine non-duplicate data segments;
determining, based on the size of each data segment and a compression level for the data to be processed, a second time required to perform a compression operation for each data segment, wherein a different compression level corresponds to a different compression ratio, different storage space that compressed data requires, and different time requirements to process, wherein the;
determining, based on the first time, the second time, and a de-duplication rate for the data to be processed, a target mode for processing the multiple data segments from a first mode and a second mode,
wherein in the first mode, a compression operation is performed only on the non-duplicate data segments in the multiple data segments based on a time required to process the data using the first mode, the first time, the second time, and the de-duplication rate of the data to be processed, and
wherein in the second mode, a compression operation is performed on each of the multiple data segments; and
performing the matching operation and the compression operation based on the target mode.

8. The electronic device according to claim 7, wherein determining the target mode includes:
determining that the target mode is the first mode if it is determined that the de-duplication rate is greater than a ratio of the first time to the second time; and
determining that the target mode is the second mode if it is determined that the de-duplication rate is less than the ratio of the first time to the second time.

9. The electronic device according to claim 7, wherein the target mode is the first mode, and the actions further comprise:
performing the matching operation for the multiple data segments, respectively;
determining, based on results of the matching operations, a set of data segments to be compressed from the multiple data segments; and
performing the compression operation on the set of data segments to be compressed in accordance with the compression level.

10. The electronic device according to claim 7, wherein the target mode is the second mode, and the actions further comprise:
performing the matching operation and the compression operation on each of the multiple data segments in accordance with the compression level.

11. The electronic device according to claim 7, wherein determining the first time includes:
determining an average of sizes of data segments that were processed over a historical time period; and
determining the first time based on the average.

12. The electronic device according to claim 7, wherein determining the second time includes:
acquiring a compression-level mapping table, wherein the compression-level mapping table includes multiple compression operation times corresponding to multiple sizes of data segments and multiple compression levels; and
determining the second time from the multiple compression operation times based on the compression-level mapping table, the sizes of the data segments, and the compression levels.

13. A computer program product that is tangibly stored on a non-transitory computer-readable medium and includes machine-executable instructions, which when executed by a processor, cause the processor to perform actions, the actions comprising:
determining, based on sizes of multiple data segments included in data to be processed, a first time required to perform a matching operation for each data segment, wherein the matching operation is used to determine non-duplicate data segments;
determining, based on the size of each data segment and a compression level for the data to be processed, a second time required to perform a compression operation for each data segment, wherein a better compression level corresponds to a higher compression ratio, less storage space that compressed data requires, and more time requirements to process;
determining, based on the first time, the second time, and a de-duplication rate for the data to be processed, a target mode for processing the multiple data segments from a first mode and a second mode,
wherein in the first mode, a compression operation is performed only on the non-duplicate data segments in the multiple data segments based on a time required to process the data using the first mode, the first time, the second time, and the de-duplication rate of the data to be processed, and
wherein in the second mode, a compression operation is performed on each of the multiple data segments; and
performing the matching operation and the compression operation based on the target mode.

14. The computer program product according to claim 13, wherein determining the target mode includes:
determining that the target mode is the first mode if it is determined that the de-duplication rate is greater than a ratio of the first time to the second time; and
determining that the target mode is the second mode if it is determined that the de-duplication rate is less than the ratio of the first time to the second time.

15. The computer program product according to claim 13, wherein the target mode is the first mode, and the actions further comprise:

performing the matching operation for the multiple data segments, respectively;

determining, based on results of the matching operations, a set of data segments to be compressed from the multiple data segments; and performing the compression operation on the set of data segments to be compressed in accordance with the compression level.

16. The computer program product according to claim 13, wherein the target mode is the second mode, and the actions further comprise:

performing the matching operation and the compression operation on each of the multiple data segments in accordance with the compression level.

17. The computer program product according to claim 13, wherein determining the first time includes:

determining an average of sizes of data segments that were processed over a historical time period; and determining the first time based on the average.

18. The computer program product according to claim 13, wherein determining the second time includes:

acquiring a compression-level mapping table, wherein the compression-level mapping table includes multiple compression operation times corresponding to multiple sizes of data segments and multiple compression levels; and determining the second time from the multiple compression operation times based on the compression-level mapping table, the sizes of the data segments, and the compression levels.

\* \* \* \* \*